(12) United States Patent
Shimizu et al.

(10) Patent No.: US 7,705,402 B2
(45) Date of Patent: Apr. 27, 2010

(54) SEMICONDUCTOR DEVICE INCLUDING A NITRIDE CONTAINING FILM TO GENERATE STRESS FOR IMPROVING CURRENT DRIVING CAPACITY OF A FIELD EFFECT TRANSISTOR

(75) Inventors: Akihiro Shimizu, Hitachinaka (JP); Nagatoshi Ooki, Shimizu (JP); Yusuke Nonaka, Tachikawa (JP); Katsuhiko Ichinose, Tokorozawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/190,433

(22) Filed: Aug. 12, 2008

(65) Prior Publication Data

US 2008/0303091 A1 Dec. 11, 2008

Related U.S. Application Data

(60) Division of application No. 11/641,758, filed on Dec. 20, 2006, now Pat. No. 7,411,253, which is a continuation of application No. 11/541,575, filed on Oct. 3, 2006, now Pat. No. 7,414,293, which is a division of application No. 10/363,065, filed on Aug. 13, 2003, now Pat. No. 7,115,954.

(30) Foreign Application Priority Data

Nov. 22, 2000 (JP) .............................. 2000-356497

(51) Int. Cl.
  *H01L 27/092* (2006.01)
(52) U.S. Cl. ................. 257/351; 257/369; 257/E27.062
(58) Field of Classification Search ......... 257/347–354, 257/357–359, 365–377, E27.062–E27.067
  See application file for complete search history.

(56) References Cited

U.S. PATENT DOCUMENTS 5,471,073 A 11/1995 Kohno (Continued)

FOREIGN PATENT DOCUMENTS

JP 05-326445 12/1993

(Continued)

OTHER PUBLICATIONS

Ghani et al.; "100 nm Gate Length High Performance / Low Power CMOS Transistor Structure"; Electron Devices Meeting, 1999. IEDM Technical Digest. International; Dec. 5-8, 1999; pp. 415-418.*

(Continued)

*Primary Examiner*—Marcos D. Pizarro
(74) *Attorney, Agent, or Firm*—Antonelli, Terry, Stout & Kraus, LLP.

(57) ABSTRACT

A semiconductor device includes an n channel conductivity type FET having a channel formation region formed in a first region on a main surface of a semiconductor substrate and a p channel conductivity type FET having a channel formation region formed in a second region of the main surface, which second region is different from the first region. An impurity concentration of a gate electrode of the n channel FET has an impurity concentration greater than an impurity concentration of the gate electrode of the p channel FET to thereby create a tensile stress in the direction of flow of a drain current in the channel forming region of the n channel FET. The tensile stress in the flow direction of the drain current in the channel forming region of the n channel FET is greater than a tensile stress in the direction of flow of a drain current in the channel forming region of the p channel FET.

12 Claims, 8 Drawing Sheets

U.S. PATENT DOCUMENTS

| | | | |
|---|---|---|---|
| 5,567,642 A | 10/1996 | Kim et al. | |
| 5,592,004 A | 1/1997 | Tamura et al. | |
| 6,046,494 A | 4/2000 | Brigham et al. | |
| 6,091,121 A * | 7/2000 | Oda | 257/408 |
| 6,194,256 B1 * | 2/2001 | Lee et al. | 438/197 |
| 6,221,064 B1 | 4/2001 | Nadal | |
| 6,281,532 B1 | 8/2001 | Doyle et al. | |
| 6,503,826 B1 | 1/2003 | Oda | |
| 6,750,486 B2 | 6/2004 | Sugawara et al. | |
| 6,982,465 B2 | 1/2006 | Kumagai et al. | |

FOREIGN PATENT DOCUMENTS

| | | |
|---|---|---|
| JP | 07-135208 | 5/1995 |
| JP | 08-153718 | 6/1996 |
| JP | 08-213481 | 8/1996 |
| JP | 09-326487 | 12/1997 |
| JP | 10-004145 | 1/1998 |
| JP | 11-135727 | 5/1999 |
| JP | 11-145464 | 5/1999 |
| JP | 11-340337 | 12/1999 |
| JP | 2000-036567 | 2/2000 |
| JP | 2000-036605 | 2/2000 |
| JP | 2000-183182 | 6/2000 |
| JP | 2000-216377 | 8/2000 |
| KR | 2000-003493 | 1/2000 |

OTHER PUBLICATIONS

Hamada, A. et al, "A New Aspect of Mechanical Stress Effects in Scaled MOS Devices." IEEE Transactions on Electron Devices, vol. 35, No. 4, Apr. 1991, pp. 895-900.

* cited by examiner n-ch MISFET    p-ch MISFET (a)

(b)

(c)

SEMICONDUCTOR DEVICE INCLUDING A NITRIDE CONTAINING FILM TO GENERATE STRESS FOR IMPROVING CURRENT DRIVING CAPACITY OF A FIELD EFFECT TRANSISTOR

CROSS REFERENCE TO RELATED APPLICATION

This application is a divisional application of application Ser. No. 11/641,758, filed Dec. 20, 2006 (now U.S. Pat. No. 7,411,253), which, in turn, is a continuation of U.S. application Ser. No. 11/541,575, filed Oct. 3, 2006 (now U.S. Pat. No. 7,414,293), which, in turn, is a divisional application of application Ser. No. 10/363,065, filed Aug. 13, 2003 (now U.S. Pat. No. 7,115,954) which was filed in accordance with 35 USC §371 from PCT/JP01/05633, filed on Jun. 29, 2001, the disclosures of which are hereby incorporated by reference.

TECHNICAL FIELD

The present invention relates to a semiconductor device and to its manufacture; and, more particularly, the invention relates to a technique that is effective when applied to a semiconductor device having an n-channel conductivity type MISFET and a p-channel conductivity type MISFET on one substrate, and to its method of manufacture.

BACKGROUND OF THE INVENTION

One well-known type of field effect transistor, to be mounted on a semiconductor device, in an insulated gate type field effect transistor called a MISFET (Metal Insulator Semiconductor Field Effect Transistor). A MISFET is widely used as a circuit element constituting an integrated circuit, because it facilitates high integration.

A MISFET, whether it has an n channel conductivity type or a p channel conductivity type, usually has a channel formation region, a gate insulator, a gate electrode, a source region, a drain region and the like. The gate insulator is disposed in an element formation region on the surface (one main surface) of a semiconductor substrate on which a circuit is to be formed, and it is formed, for example, of a silicon oxide film. The gate electrode is disposed, via the gate insulator, on the element formation region of the surface of the semiconductor substrate on which a circuit is to be formed, and it is formed, for example, of a polycrystalline silicon film into which an impurity has been introduced to reduce the resistance. The channel formation region is disposed in a region (right below the gate electrode) of the semiconductor substrate, opposite to the gate electrode. The source and drain regions are formed of semiconductor regions (impurity diffusion regions) disposed on both sides of the channel formation region in a channel length direction.

A MISFET having a gate insulator made of a silicon oxide film is usually called a MOSFET (Metal Oxide Semiconductor Field Effect Transistor). The term "channel formation region" means a region wherein a current channel connecting the source region with the drain region is to be formed.

SUMMARY OF THE INVENTION

In the process of fabrication of an ultrafine CMIS (Complementary MIS) device, in the generation of a gate length on the level of 0.1 μm, the introduction of new materials and the suppression of short channel effects of a MISFET accelerate any temperature reducing tendency. This presumably leaves a process-induced residual stress in a device. The process-induced residual stress acts on the superficial portion of the surface on which a circuit is to be formed (hereinafter simply called a "circuit formation surface"), that is, on the channel formation region of a MISFET.

In the ordinarily employed CMIS (complementary MIS) process, for example, when an interlevel insulating film is formed on the circuit formation surface of a semiconductor substrate, a stress acting on the channel formation region of a MISFET is almost the same in one chip, because the same material is used on both the n channel conductivity type MISFET and the p channel conductivity type MISFET. In addition, it is the common practice to make a process-wise device for reducing the stress acting on the channel formation region of the n channel conductivity type MISFET and the p channel conductivity type MISFET.

It is known that, with regard to a change in the transistor characteristics in response to a stress on the channel formation region, when the stress is applied in a direction (gate length direction) similar to the direction of flow of a drain current (Id), the following occurs:

(1) the drain current of the n channel conductivity type MISFET is reduced in response to a compressive stress, but increases in response to a tensile stress; and (2) the drain current of the p channel conductivity type MISFET is increased in response to a compressive stress, but decreases in response to a tensile stress. However, this change is only several % (refer to literature: IEEE TRANSACTIONS ON ELECTRON DEVICES, 38(4), April, 898-900 (1991)). This is partly because annealing is conducted at a sufficiently high temperature for long hours in the generation of a gate length as long as 1 μm.

As a result of investigation of the above-described technique, the present inventors have found the following described problems.

It has been found that, when the gate length of a MISFET is miniaturized, even to 0.1 μm or so, and a temperature reduction of the process is carried out, the residual stress increases and the stress in the channel formation region has a significant influence on the transistor characteristics.

It has been found that a change in conditions for formation of a plasma CVD nitride film (a nitride film formed by plasma CVD) for self align contact, which film also serves as an interlevel insulating film, after formation of a MISFET, causes a remarkable change in the stress in the film from a compressive direction to a tensile direction, which change is accompanied by a marked change in the transistor characteristics of the MISFET. This is apparent from FIG. 2, which illustrates the dependence of a drain current on the stress of an interlevel insulating film. However, it is to be noted that the stress is not an internal stress in the channel formation region of a MISFET, but is the stress of the interlevel insulating film itself, as determined in terms of the bow of a wafer after formation of the interlevel insulating film thereon.

The influence produced by the stress is similar to that stated in the above-described literature, but its scale becomes larger by at least a single FIGURE, more specifically, ±10 to 20%. In addition, the n channel conductivity type MISFET and the p channel conductivity type MISFET demonstrate an utterly opposite tendency with regard to an increase or decrease in the drain current, depending on the stress of the film.

Accordingly, when the intensity of an internal stress is changed by changing the conditions for formation of an interlevel insulating film, the drain current of the n channel type MISFET and that of the p channel type MISFET do not exhibit the same increasing or decreasing tendency, which inhibits a simultaneous improvement in the drain current of these elements.

On and after the 0.1-micron generation, fluctuations in the drain current due to this stress even reach levels of ±10 to 20% or greater, resulting in a problem, such as a change in the balance of the drain current between the n channel type MISFET and the p channel type MISFET.

An object of the present invention is to provide a technique that is capable of improving the current driving capacity of an n channel conductivity type field effect transistor and a p channel conductivity type field effect transistor.

Another object of the present invention is to provide a technique that is capable of suppressing a lowering of the current driving capacity of one of the n channel conductivity type field effect transistor and a p channel conductivity type field effect transistor, while improving the current driving capacity of the other one.

The above-described and other objects, and novel features of the present invention will be apparent from the description herein and the accompanying drawings.

Among the features of the invention disclosed in the present application, typical aspects of the invention will be summarized simply below.

(1) A semiconductor device has an n channel conductivity type field effect transistor having a channel formation region formed in a first region on one main surface of a semiconductor substrate and a p channel conductivity type field effect transistor having a channel formation region formed in a second region on the one main surface of the semiconductor substrate, which second region is different from the first region, wherein an internal stress generated in the channel formation region of the n channel conductivity type field effect transistor is a tensile stress, while an internal stress generated in the channel formation region of the p channel conductivity type field effect transistor is a compressive stress.

(2) A semiconductor device has an n channel conductivity type field effect transistor having a channel formation region formed in a first region on one main surface of a semiconductor substrate and a p channel conductivity type field effect transistor having a channel formation region formed in a second region on the one main surface of the semiconductor substrate, which second region is different from the first region, wherein when the internal stresses generated in the channel formation regions of the n channel conductivity type field effect transistor and the p channel conductivity type field effect transistor are each a compressive stress, the compressive stress generated in the channel formation region of the p channel conductivity type field effect transistor is greater than the compressive stress generated in the channel formation region of the n channel conductivity type field effect transistor.

(3) A semiconductor device has an n channel conductivity type field effect transistor having a channel formation region formed in a first region on one main surface of a semiconductor substrate and a p channel conductivity type field effect transistor having a channel formation region formed in a second region on the one main surface of the semiconductor substrate, which second region is different from the first region, wherein when the internal stresses generated in the channel formation regions of the n channel conductivity type field effect transistor and the p channel conductivity type field effect transistor are each a tensile stress, the tensile stress generated in the channel formation region of the n channel conductivity type field effect transistor is greater than the tensile stress generated in the channel formation region of the p channel conductivity type field effect transistor.

(4) A semiconductor device has an n channel conductivity type field effect transistor having a channel formation region formed in a first region on one main surface of a semiconductor substrate and a p channel conductivity type field effect transistor having a channel formation region formed in a second region on the one main surface of the semiconductor substrate, which second region is different from the first region, which further comprises at least one of a film for generating a tensile stress in the channel formation region of the n channel conductivity type field effect transistor and a film for generating a compressive stress in the formation region of the p type channel conductivity type field effect transistor.

(5) A semiconductor device according the above-described aspect (4), wherein the film is a silicon nitride film. Examples of the silicon nitride film include a silicon nitride (for example, $Si_3N_4$) film formed by LP-CVD (Low Pressure-Chemical Vapor Deposition), a silicon nitride (for example, $Si_3N_4$) film formed by plasma CVD and a silicon nitride (for example, $Si_3N_4$) film formed by single-wafer thermal CVD.

(6) A semiconductor device according to the above-described aspect (4), wherein the film for generating a tensile stress in the channel formation region of the n channel conductivity type field effect transistor is a film formed over the one main surface of the semiconductor substrate to cover the n channel conductivity type field effect transistor; and the film for generating a compressive stress in the channel formation region of the p channel conductivity type field effect transistor is a film formed over the one main surface of the semiconductor substrate to cover the p channel conductivity type field effect transistor.

(7) A semiconductor device according to the above-described aspect (4), wherein the film for generating a tensile stress in the channel formation region of the n channel conductivity type field effect transistor is a gate electrode of the n channel conductivity type field effect transistor or side wall spacers formed on the side walls of the gate electrode, and the film for generating a compressive stress in the channel formation region of the p channel conductivity type field effect transistor is a gate electrode of the p channel conductivity type field effect transistor or side wall spacers formed on the side walls of the gate electrode.

(8) A method of manufacture of a semiconductor device, having an n channel conductivity type field effect transistor having a channel formation region formed in a first region on one main surface of a semiconductor substrate and a p channel conductivity type field effect transistor having a channel formation region formed in a second region on the one main surface of the semiconductor substrate, which second region is different from the first region, includes the step of, after formation of the n channel conductivity type field effect transistor and p channel conductivity type field effect transistor, forming at least one of a film for generating a tensile stress in the channel formation region of the n channel conductivity type field effect transistor and a film for generating a compressive stress in the channel formation region of the p channel conductivity type field effect transistor.

(9) A method of manufacture of a semiconductor device according to the above-described aspect (8), wherein the film is a silicon nitride film.

(10) A method of manufacture of a semiconductor device, having an n channel conductivity type field effect transistor having a channel formation region formed in a first region on one main surface of a semiconductor substrate and a p channel conductivity type field effect transistor having a channel formation region formed in a second region on the one main surface of the semiconductor substrate, which second region is different from the first region, includes the step of forming the n channel conductivity type field effect transistor and p channel conductivity type field effect transistor; forming, over the first region and second region on the one main surface of the semiconductor substrate, an insulating film for generating a compressive stress in the channel formation region of the p channel conductivity type field effect transistor, and selectively introducing an impurity to the insulating film over the second region on the one main surface of the semiconductor substrate, thereby relaxing the compressive stress generated in the channel formation region of the n channel conductivity type field effect transistor.

(11) A method of manufacture of a semiconductor device, having an n channel conductivity type field effect transistor having a channel formation region formed in a first region on one main surface of a semiconductor substrate and a p channel conductivity type field effect transistor having a channel formation region formed in a second region on the one main surface of the semiconductor substrate, which second region is different from the first region, includes the steps of forming the n channel conductivity type field effect transistor and p channel conductivity type field effect transistor; forming, over the first region and second region on the one main surface of the semiconductor substrate, an insulating film for generating a tensile stress in the channel formation region of the n channel conductivity type field effect transistor, and selectively introducing an impurity to the insulating film over the first region on the one main surface of the semiconductor substrate, thereby relaxing a tensile stress generated in the channel formation region of the p channel conductivity type field effect transistor.

The important point in the constitution of the present invention will be described next.

What is important in this invention is to control the direction or intensity of stress acting on the channel formation region of each of the n channel conductivity type field effect transistor and the n channel conductivity type field effect transistor, so as to increase each drain current. This control is carried out, for example, in the following manner:

1) Different materials, between the n channel conductivity type field effect transistor and the p channel conductivity type field effect transistor, are used for a film formed over one main surface of a semiconductor substrate, so that a tensile stress will act on the channel formation region of the n channel conductivity type field effect transistor and a compressive stress will act on the channel formation region of the p channel conductivity type field effect transistor.

2) When a compressive stress acts on the channel formation region of each of the n channel conductivity type field effect transistor and the p channel conductivity type field effect transistor, the material of the film to be formed on one main surface of a semiconductor substrate is changed so that the compressive stress acting on the channel formation region of the n channel conductivity type field effect transistor is smaller than that acting on the channel formation region of the p channel conductivity type field effect transistor.

3) When a tensile stress acts on the channel formation region of each of the n channel conductivity type field effect transistor and the p channel conductivity type field effect transistor, the material of the film to be formed on one main surface of a semiconductor substrate is changed so that the tensile stress acting on the channel formation region of the p channel conductivity type field effect transistor is smaller than that acting on the channel formation region of the n channel conductivity type field effect transistor.

By the above-described techniques, the drain currents of the n channel conductivity type field effect transistor and the p channel conductivity type field effect transistor can be increased simultaneously, compared with the n channel conductivity type field effect transistor and the p channel conductivity type field effect transistor that are fabricated in a conventional manner. In addition, the drain current ratio of the n channel conductivity type field effect transistor to the p channel conductivity type field effect transistor can be set freely to some extent.

More specifically, a tensile stress is imparted to the channel formation region of the n channel conductivity type field effect transistor, while a compressive stress is imparted to the channel formation region of the p channel conductivity type field effect transistor, resulting in an increase in the drain current in both the n channel conductivity type field effect transistor and the p channel conductivity type field effect transistor, depending on the intensity of the stress acting on the channel formation region of each of the n channel conductivity type field effect transistor and the p channel conductivity type field effect transistor, as illustrated in FIG. 2.

Since the stress acting on the n channel conductivity type field effect transistor and that acting on the p channel conductivity type field effect transistor can be controlled, respectively, the drain current ratio of the n channel conductivity type field effect transistor to the p channel conductivity type field effect transistor can be controlled freely.

The following description provides definitions of some of the terms used herein.

The term "tensile stress" acting on the channel formation region of a field effect transistor means a stress to make a lattice constant of Si greater than that under equilibrium when the channel formation region is silicon (Si).

The term "compressive stress" acting on the channel formation region of a field effect transistor means a stress to make a lattice constant of Si smaller than that under equilibrium when the channel formation region is silicon (Si).

The term "tensile stress of a film" means a stress for generating a tensile stress in the channel formation region of a field effect transistor.

The term "compressive stress of a film" means a stress for generating a compressive stress in the channel formation region of a field effect transistor.

The gist of the present invention resides in the characteristic that an interatomic distance of a silicon atom in a channel formation region is different between an n channel conductivity type field effect transistor and p channel conductivity type field effect transistor, meaning that the size of the strain is different between them and that the interatomic distance of silicon is greater in the channel formation region of the n channel conductivity type field effect transistor than it is in the channel formation region of the p channel conductivity type field effect transistor.

BEST MODE FOR CARRYING OUT THE INVENTION

Figure 1:
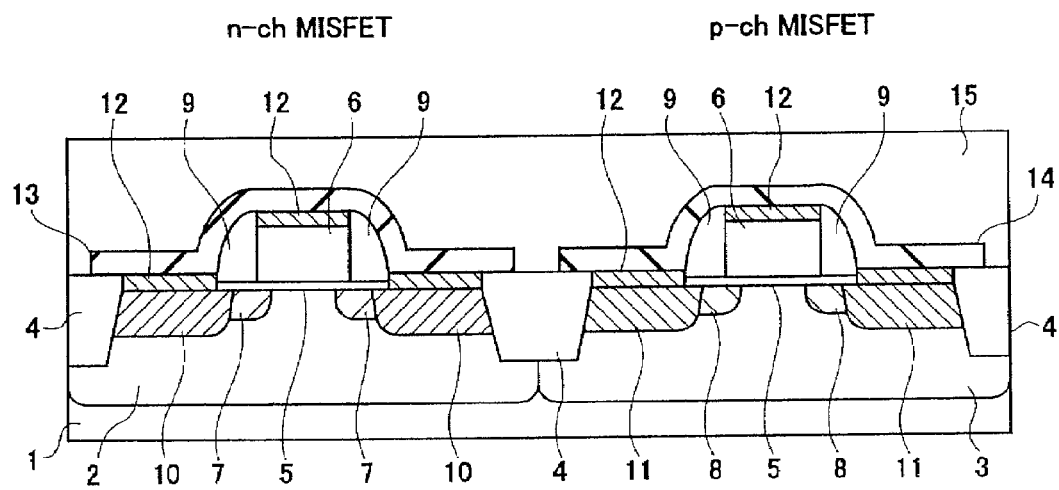
FIG. 1 is a schematic cross-sectional view roughly illustrating the structural configuration of a semiconductor device according to Embodiment 1 of the present invention.

Various embodiments of the present invention will be described in detail with reference to the accompanying drawings. In all of the drawings, members having a like function will be identified by like reference numerals, and overlapping descriptions thereof will be omitted.

Embodiment 1

In the description of Embodiment 1, an example of application of the present invention to a semiconductor device, including a complementary MISFET and having a supply voltage of 1 to 1.5V and a gate length of about 0.1 to 0.14 μm, will be considered.

Figure 2:
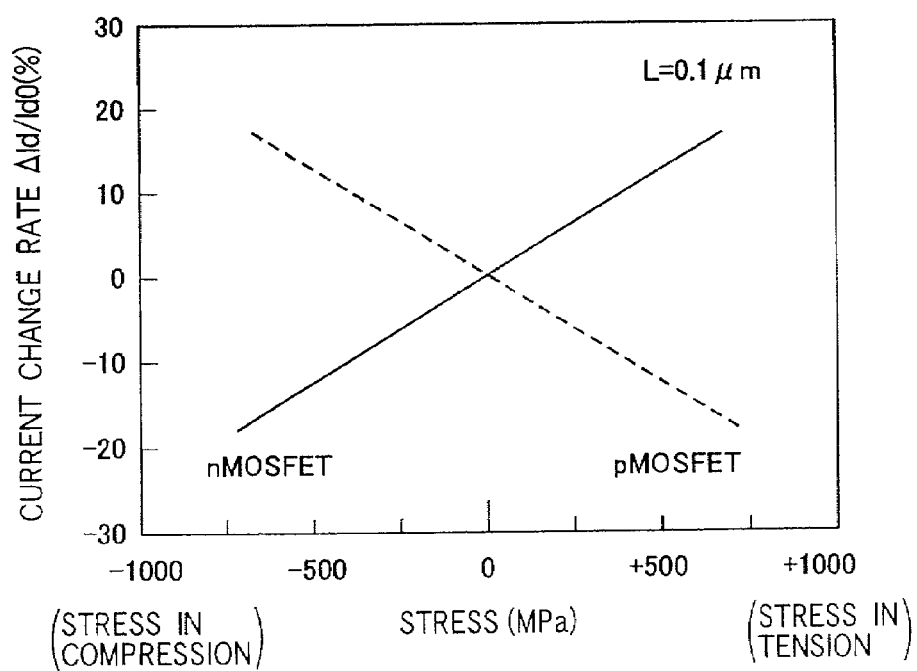
FIG. 2 is a characteristic diagram illustrating the relation between current driving capacity and film stress.
Figure 3:
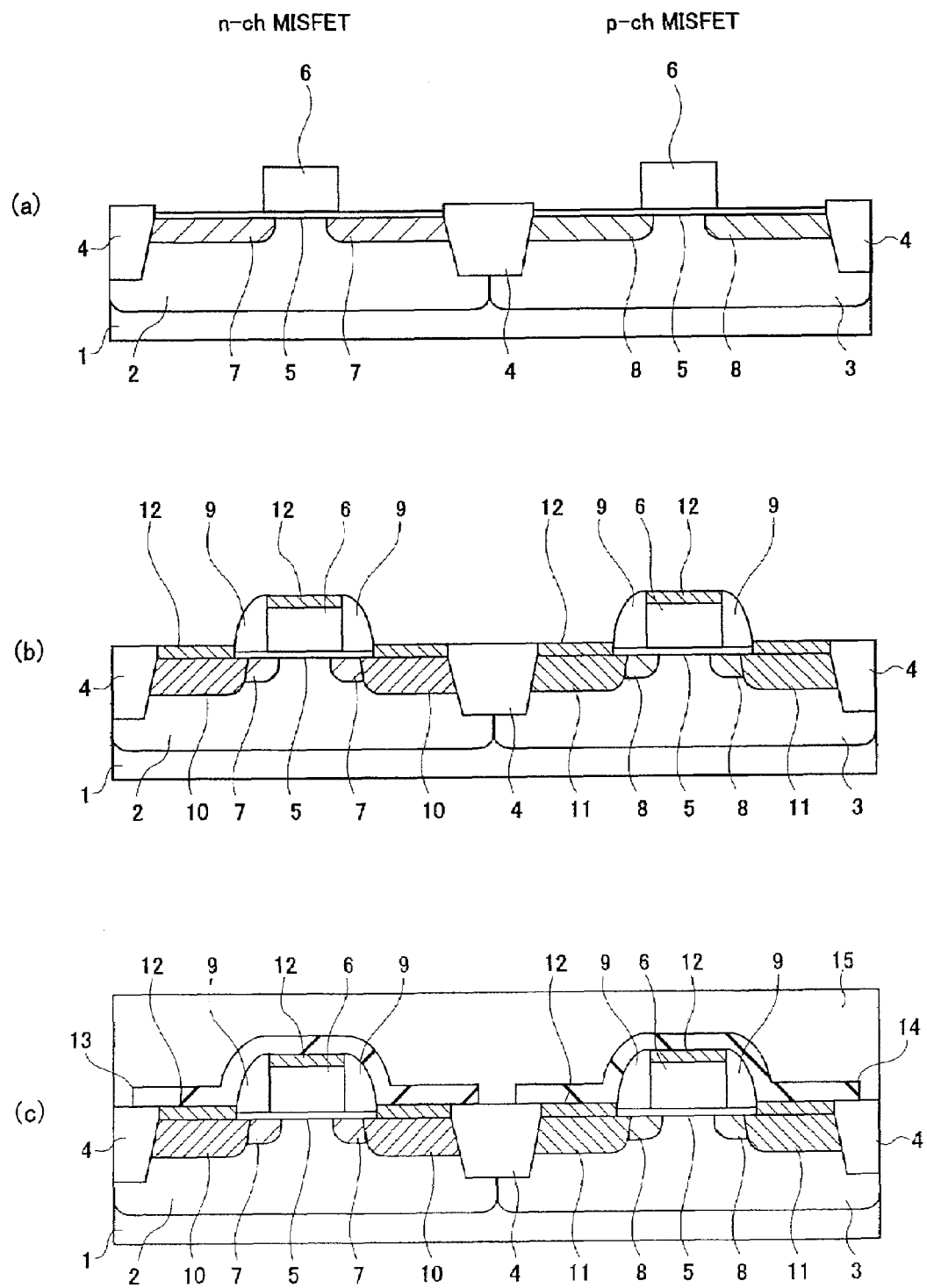
FIG. 3 is a process flow diagram in which views (a), (b) and (c) are each a schematic cross-sectional view of the structure in successive steps in the manufacture of the semiconductor device of FIG. 1.

FIG. 1 is a schematic cross-sectional view roughly illustrating the constitution of a semiconductor device according to Embodiment 1 of the present invention; FIG. 2 is a characteristic diagram illustrating the relation between current driving capacity and film stress; and FIG. 3 is a process flow diagram in which views (a), (b) and (c) are schematic cross-sectional views of the structure in successive steps in the fabrication of the semiconductor device of FIG. 1. In FIG. 1 and FIG. 3, an n channel conductivity type MISFET is illustrated on the left side, while a p channel conductivity type MISFET is illustrated on the right side.

As illustrated in FIG. 1, the semiconductor device of this Embodiment has, as a semiconductor substrate, a p type silicon substrate 1 that is made of, for example, single crystal silicon. The circuit formation surface (one main surface) of the p type silicon substrate 1 has a first element formation region and a second element formation region, and the first element formation region and second element formation region are separated, for example, by a shallow groove isolation region (SGI) 4, which is an element-element isolating and separating region. In the first element formation region, a p type well region 2 and an n channel conductivity type MISFET are formed; while, in the second element formation region, an n type well region 3 and p channel conductivity type MISFET are formed. The shallow groove isolation region 4 is formed by defining a shallow groove in the circuit formation surface of the p type silicon substrate 1, and then selectively embedding an insulating film (ex. silicon oxide film) in the shallow groove.

The n channel conductivity type MISFET is mainly comprised of a channel formation region, a gate insulator 5, a gate electrode 6, side wall spacers 9 and source and drain regions. The source and drain regions have n type semiconductor regions (extension regions) 7 and n type semiconductor regions 10. The n type semiconductor regions 7 are formed in self alignment with the gate electrode 6, while the n type semiconductor regions 10 are formed in self alignment with the side wall spacers 9, that are disposed on the side walls of the gate electrode 6. The n type semiconductor regions 10 are formed to have a higher impurity concentration than the n type semiconductor regions 7.

The p channel conductivity type MISFET has a channel formation region, a gate insulator 5, a gate electrode 6, side wall spacers 9 and source and drain regions. The source and drain regions have p type semiconductor regions (extension regions) 8 and p type semiconductor regions 11. The p type semiconductor regions 8 are formed in self alignment with the gate electrode 6, while the p type semiconductor regions 11 are formed in self alignment with the side wall spacers 9, that are disposed on the side walls of the gate electrode 6. The p type semiconductor regions 11 are formed to have a higher impurity concentration than the p type semiconductor regions 8.

On the surfaces of each of the gate electrodes 6, the n type semiconductor regions 10 and the p type semiconductor regions 11, a silicide layer (a metal-semiconductor reaction layer) 12 is formed to lower the resistance. On the circuit formation surface of the p type silicon substrate 1, an interlevel insulating film 15, that is made of, for example, a silicon oxide film, is formed.

Between the n channel conductivity type MISFET and the interlevel insulating film 15, a silicon nitride film 13 is formed as a first nitride film for generating a tensile stress on the circuit formation surface of the p type silicon substrate 1. Between the p channel conductivity type MISFET and the interlevel insulating film 15, a silicon nitride film 14 is formed as a second silicide film for generating a compressive stress on the circuit formation surface of the p type silicon substrate 1. In this Embodiment, the silicon nitride film 13 is formed selectively over the circuit formation surface of the p type silicon substrate 1 so as to cover the n channel conductivity type MISFET, while the silicon nitride film 14 is selectively formed over the circuit formation surface of the p type silicon substrate 1 so as to cover the p channel conductivity type MISFET.

The silicon nitride films 13 and 14 are formed, for example, by plasma CVD. The stress generated on the circuit formation surface of the p type silicon substrate 1 can be controlled by changing the conditions (reaction gas, pressure, temperature, high-frequency power, etc) for forming these silicon nitride films 13 and 14. In this Embodiment, the silicon nitride film 13 is formed, for example, by lowering the high frequency power to 300 to 400 W upon film formation, thereby controlling the stress which is to be generated on the circuit formation surface of the p type silicon substrate 1 in the tensile direction. The silicon nitride film 14 is formed, for example, by raising the high frequency power to 600 to 700 W upon film formation, thereby controlling the stress which is to be generated on the circuit formation surface of the p type silicon substrate 1 in the compressive direction.

Since a tensile stress of about +700 to +800 MPa exists in the silicon nitride film 13 thus formed and a compressive stress of about −900 to −1000 MPa exists in the silicon nitride film 14, a tensile stress appears in the channel formation region of the n channel conductivity type MISFET and a compressive stress appears in the channel formation region of the p channel conductivity type MISFET. As a result, as illustrated in FIG. 2, compared with the case where no silicon nitride film 13 or 14 is provided, the drain current of the n channel conductivity type MISFET is improved by 10 to 15% and that of the p channel conductivity type MISFET is improved by 15 to 20%. These stresses are applied, as described above, in a direction similar to the flow direction of the drain current (Id) of the channel formation region (in the direction of the gate length).

The method of manufacture of the semiconductor device of this Embodiment will be described with reference to FIG. 3.

First, a p type silicon substrate 1 (hereinafter simply called a "p-type substrate"), which has a specific resistance of 10 Ωcm and is made of single crystal silicon is prepared. On the circuit formation surface of the p type substrate 1, a p type well region 2 and an n type well region 3 are selectively formed.

On the circuit formation surface of the p type substrate 1, a shallow groove isolation region 4 is formed as an element isolating region for dividing a first element formation region and a second element formation region (active region). This shallow groove isolation region 4 is formed by making a shallow groove (for example, a groove of about 300 nm thick) on the circuit formation surface of the p type substrate 1, forming thereover by CVD an insulating film made of a silicon oxide film, and then planarizing the surface by CMP (Chemical Mechanical Polishing) so as to leave the insulating film only inside of the shallow groove.

By heat treatment, a gate insulator 5, which is made of a silicon oxide film that is about 2 to 3 nm thick, is formed in the element formation region on the circuit formation surface of the p type substrate 1. Then, all over the circuit formation surface of the p type substrate 1, a polycrystalline silicon film of about 150 to 200 nm thick is deposited by CVD, followed by patterning of the polycrystalline silicon film to form a gate electrode 6. Into the polycrystalline silicon film, an impurity for reducing the resistance is introduced during or after deposition.

A pair of n type semiconductor regions (extension regions) 7 are formed by selectively introducing, for example, arsenic (As) as an impurity by ion implantation into a portion of the p type well region 2 on which the gate electrode has not been formed, while a pair of p type semiconductor regions (extension regions) 8 are formed by selectively introducing, for example, boron difluoride (BF2) as an impurity by ion implantation into a portion of the n type well region 3 on which the gate electrode has not been formed. Formation of the n type semiconductor regions 7 is conducted while covering the pMIS formation region with a photoresist mask, and formation of the p type semiconductor regions 8 is conducted while covering the nMIS formation region with a photoresist mask. Arsenic is introduced at an acceleration energy of 1 to 5 KeV and a dose of 1 to $2\times10^{15}/cm^2$, and boron difluoride is introduced at an acceleration energy of 1 to 5 KeV and a dose of 1 to $2\times10^{15}/cm^2$. The above-described steps are illustrated collectively in FIG. 3 at view (a).

As illustrated in FIG. 3 at view (b), side wall spacers 9 having, for example, a film thickness of about 50 to 70 nm in the direction of the gate length are formed over the side walls of the gate electrode 6. These side wall spacers 9 are formed by depositing an insulating film made of a silicon oxide film or a silicon nitride film all over the circuit formation surface of the p type substrate 1 by CVD, followed by anisotropic etching, such as RIE (Reactive Ion Etching).

A pair of n type semiconductor regions 10 are formed by selectively introducing, for example, arsenic (As) as an impurity by ion implantation into a portion of the p type well region 2 on which neither the gate electrode 6 nor side wall spacers 9 have been formed, while a pair of p type semiconductor regions 11 are formed by selectively introducing, for example, boron difluoride (BF2) as an impurity by ion implantation into a portion of the n type well region 3 on which neither the gate electrode 6 nor side wall spacers 9 have been formed. Formation of the n type semiconductor regions 10 is conducted while covering the pMIS formation region with a photoresist mask, and formation of the p type semiconductor regions 11 is conducted while covering the nMIS formation region with a photoresist mask. Arsenic is introduced at an acceleration energy of 35 to 45 KeV and a dose of 2 to $4\times10^{15}/cm^2$, and boron difluoride is introduced at an acceleration energy of 40 to 50 KeV and dose of 2 to $4\times10^{15}/cm^2$.

In the above-described steps, a source region and a drain region, each composed of the n type semiconductor region 7 and n type semiconductor region 10, and also a source and a drain region, each composed of the p type semiconductor region 8 and p type semiconductor region 11, are formed.

After removal of a natural oxide film to expose the surface of each of the gate electrode 6 and semiconductor regions (10, 11), a refractory metal film, such as a cobalt (Co) film, is formed by sputtering all over the circuit formation surface of the p type substrate 1, including the surfaces of the gate electrode and semiconductor regions. Heat treatment is then performed to form a silicide (CoSix) layer 12 on the surface of the gate electrode 6 by reacting silicon (Si) of the gate electrode 6 with Co of the cobalt film and, at the same time, to form a silicide (CoSix) layer 12 on the surfaces of the semiconductor regions (10,11) by reacting Si of these semiconductor regions with Co of the cobalt film. After selective removal of an unreacted portion of the cobalt film in a region other than the region in which the silicide layer 12 has been formed, the silicide layer 12 is activated by heat treatment.

All over the circuit formation surface of the p type substrate 1, a silicon nitride film 13 of about 100 to 120 nm thick is deposited as an insulating film by plasma CVD. This silicon nitride film 13 is formed, for example, under the conditions of a high frequency power of 350 to 400 W or a chamber internal pressure of 300 to 350 Torr.

The silicon nitride film 13 is patterned by a photo etching technique so as to selectively cover the n channel conductivity type MISFET, as illustrated in FIG. 3 at view (c). In other words, the silicon nitride film 13 over the p channel conductivity type MISFET is removed. The silicon nitride film 13 thus formed is capable of selectively generating a tensile stress in the channel formation region of the n channel conductivity type MISFET.

All over the circuit formation surface of the p type substrate 1, a silicon nitride film 14, which is about 100 nm thick, is deposited as an insulating film by plasma CVD. This silicon nitride film 14 is formed, for example, under the conditions of a high frequency power of 600 to 700 W or a chamber internal pressure of 5 to 10 Torr.

The silicon nitride film 14 is then patterned by a photo etching technique so as to selectively cover the p channel conductivity type MISFET as illustrated in FIG. 3 at view (c). In other words, the silicon nitride film 14 over the n channel conductivity type MISFET is removed. The silicon nitride film 14 thus formed is capable of selectively generating a compressive stress in the channel formation region of the p channel conductivity type MISFET.

An interlevel insulating film 15, which is made of, for example, a silicon oxide film, is then formed all over the circuit formation surface of the p type substrate 1 by plasma CVD, followed by planarization on the surface of this interlevel insulating film 15 by CMP. A contact hole and metallization layer are then formed in a manner known per se in the art, whereby the semiconductor device of this Embodiment is completed.

Removal of the silicon nitride films 13 and 14 is effected by anisotropic etching or wet etching. Although adoption of anisotropic etching leaves a silicon nitride film at a gate step portion and lowers the effects of the stress, it may be employed.

In this Embodiment 1, the stress is controlled most efficiently because a silicon nitride film, which is to be brought into direct contact with the gate electrode 6, is used for stress control. Particularly, the silicon nitride film for control of stress is formed after high temperature thermal treatment, such as activation of impurities in the source and drain regions, so that the film stress can be left almost as it is. In addition to an improved current driving capacity, the parasitic capacitance in an isolation region can be reduced because a silicon nitride film can be removed from this wide isolation region. A silicon nitride film has a higher dielectric constant than a silicon oxide film.

In this Embodiment 1, the silicon nitride film 14 may be omitted. This lowers the effects of improvement of the current driving capacity of the p channel conductivity type MISFET, but it can simplify the manufacturing step. The silicon nitride film 13 may be formed by single-wafer thermal CVD, or the silicon nitride films 13 and 14 may be formed to generate either a compressive stress or tensile stress and to differ from each other only in the intensity of the stress.

In short, what is important in this Embodiment 1 is to change the direction or intensity of the stress generated in at least one of the channel formation regions of the n channel conductivity type and p channel conductivity type MISFETs to increase the drain current.

In this Embodiment, formation of the silicon nitride film 13 so as to have a greater thickness makes it possible to prevent a decrease in its film thickness by over etching upon removal of the silicon nitride film 14. However, it is to be noted that no limitation is imposed on their thicknesses.

As a method of changing the film stress by changing the method of forming the silicon nitride films, the following methods can be given as examples, in addition to the above-described method of changing the high frequency power.

1) For the formation of the silicon nitride film 13, $SiH_4$, $NH_3$ and $N_2$ are employed, while for the formation of the silicon nitride film 14, $NH_3$ is omitted and only SiH4 and N2 are used. Thus, the raw material gases being employed are changed.

2) The temperature for the formation of the silicon nitride film 13 is set higher than that for the formation of the silicon nitride film 14. Thus, the film formation temperature is changed.

3) The pressure for the formation of the silicon nitride film 13 is set higher than that for the formation of the silicon nitride film 14. Thus, the film formation pressure is changed.

It is needless to say that the above-described methods may be used in combination. It is important to adjust the internal stress of the silicon nitride film 13 to the side of a tensile stress and that of the silicon nitride film 14 to the side of a compressive stress.

In the formation of a nitride film by single-wafer thermal CVD, as the pressure is lowered or the temperature is increased upon film formation, its film stress approaches a tensile stress, so that this method is suited for the silicon nitride film 13.

Embodiment 2

Figure 4:
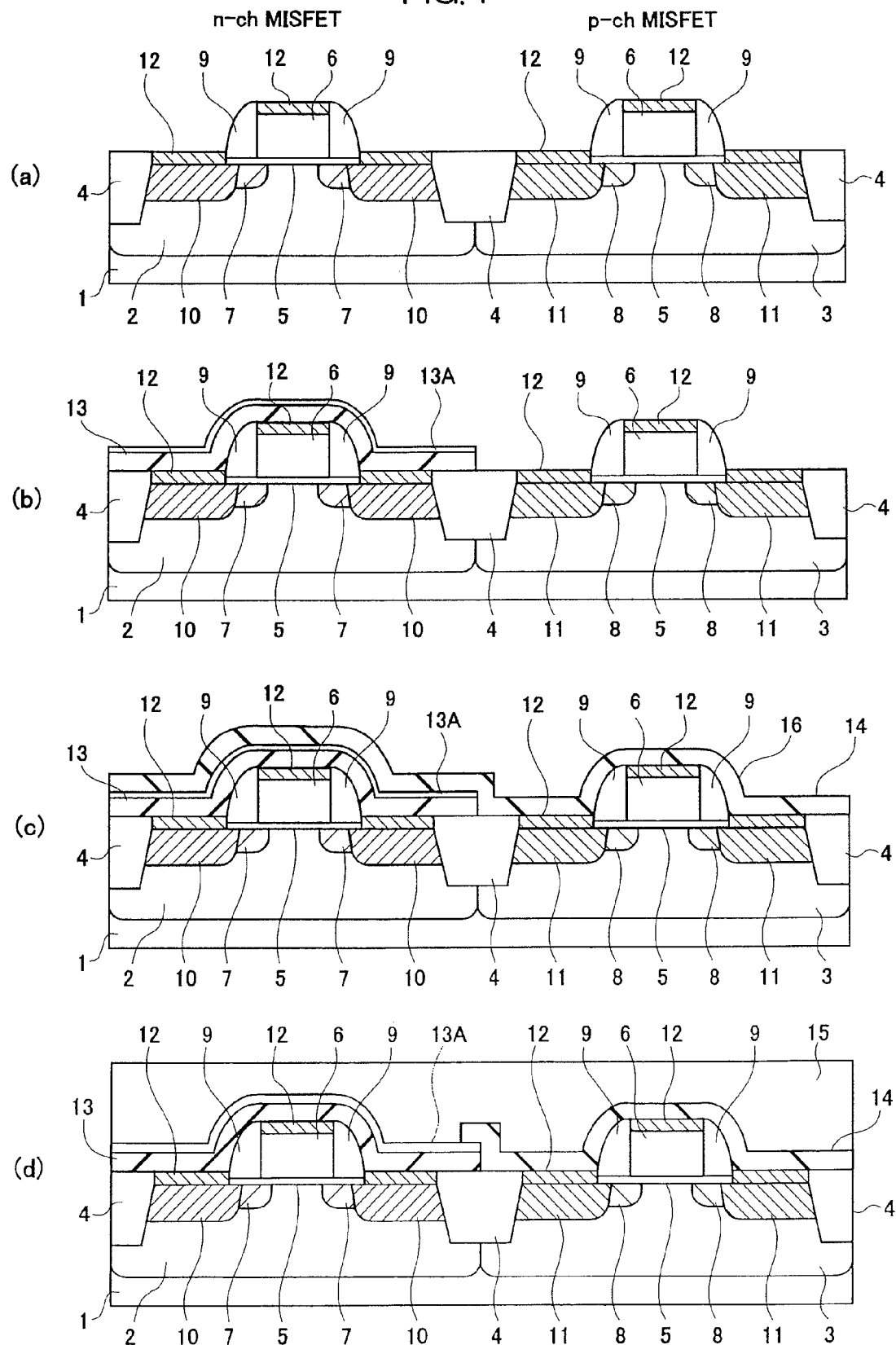
FIG. 4 is a process flow diagram in which views (a), (b), (c) and (d) are each a schematic cross-sectional view of the structure in successive steps in the manufacture of a semiconductor device according to Embodiment 2 of the present invention.

This Embodiment 2 has the objective of simplification of the manufacturing steps of the above-described Embodiment 1. FIG. 4 illustrates a process flow in which views (a), (b), (c) and (d) are each a schematic cross-sectional view of the structure in successive steps in the manufacture of a semiconductor device of Embodiment 2 of the present invention.

As illustrated in FIG. 4 at view (a), n channel conductivity type and p channel conductivity type MISFETs and a silicide layer 12 are formed in a manner similar to Embodiment 1.

All over the circuit formation surface of the p type substrate 1, a silicon nitride film 13 of about 100 to 120 nm thick is formed as an insulating film by plasma CVD. This silicon nitride film 13 is formed, for example, under conditions of a high frequency power of 350 to 400 W.

All over the circuit formation surface of the p type substrate 1, a silicon oxide film 13A is formed as an insulating film. This silicon oxide film 13A is, for example, a P-TEOS or $O_3$-TEOS oxide film.

By use of a photo-etching technique, the silicon oxide film 13A and silicon nitride film 13 are patterned successively to selectively cover the n channel conductivity type MISFET with the silicon nitride film 13 and silicon oxide film 13A, as illustrated in FIG. 4 at view (b). In other words, the silicon nitride film 13 and silicon oxide film 13A over the p channel conductivity type MISFET are removed. The silicon nitride film 13 thus formed is capable of selectively generating a tensile stress in the channel formation region of the n channel conductivity type MISFET.

As illustrated in FIG. 4 at view (c), a silicon nitride film 14 of about 100 nm thick is deposited as an insulating film all over the circuit formation surface of the p type substrate 1 by plasma CVD. This silicon nitride film 14 is formed, for example, at a high frequency power of 600 to 700 W.

By use of a photo-etching technique, the silicon nitride film 14 is patterned to selectively cover the p channel conductivity type MISFET, as illustrated in FIG. 4 at view (d). In other words, the silicon nitride film 14 over the n channel conductivity type MISFET is removed. The silicon nitride film 14 thus formed is capable of selectively generating a compressive stress in the channel formation region of the p channel conductivity type MISFET. In this step, the silicon oxide film 13A serves as an etching stopper upon photo-etching of the silicon nitride film 14. This film can suppress thinning of the silicon nitride film 13 due to over-etching upon removal of the silicon nitride film 14.

As illustrated in FIG. 4 at view (d), an interlevel insulating film 15 made of, for example, a silicon oxide film is deposited by plasma CVD all over the circuit formation surface of the p type substrate 1, followed by planarization of the surface of the interlevel insulating film 15 by CMP. Then, a contact hole and a metallization layer are formed in a manner known per se in the art, whereby the semiconductor device of this Embodiment is completed.

This Embodiment 2 brings about a marked improvement in the controllability of removal of the silicon nitride film 14, in addition to the above-described effects of Embodiment 1. As a result, the silicon nitride films 13 and 14 can be thinned with uniform thickness.

Embodiment 3

In the description of Embodiment 3, an example of application of the present invention to a semiconductor device, including a complementary MISFET and having a supply voltage of about 1 to 1.5V and a gate length of 0.1 to 0.14 µm, will be considered.

Figure 5:
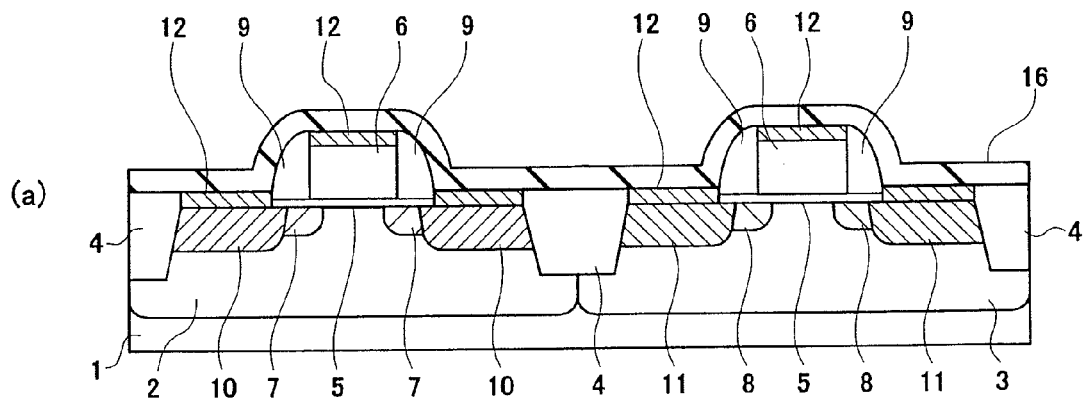
FIG. 5 is a process flow diagram in which views (a), (b) and (c) are each a schematic cross-sectional view of the structure in successive steps in the manufacture of a semiconductor device according to Embodiment 3 of the present invention.
Figure 5:
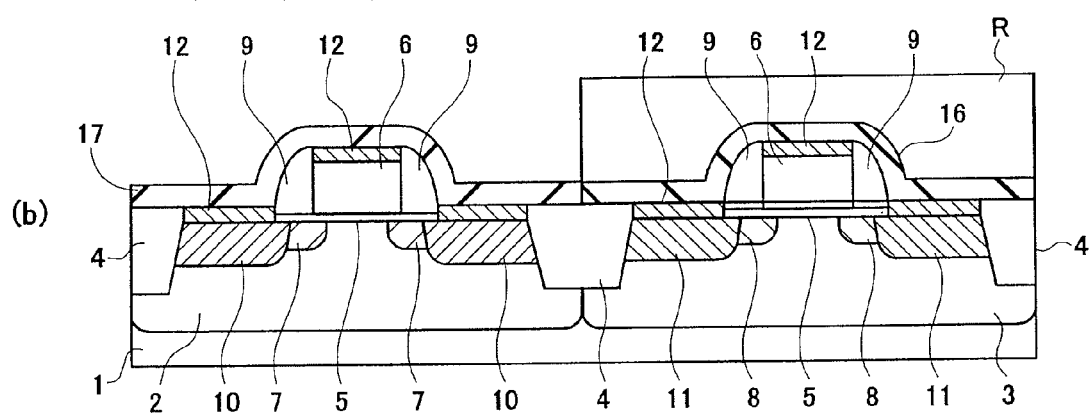
Figure 5:
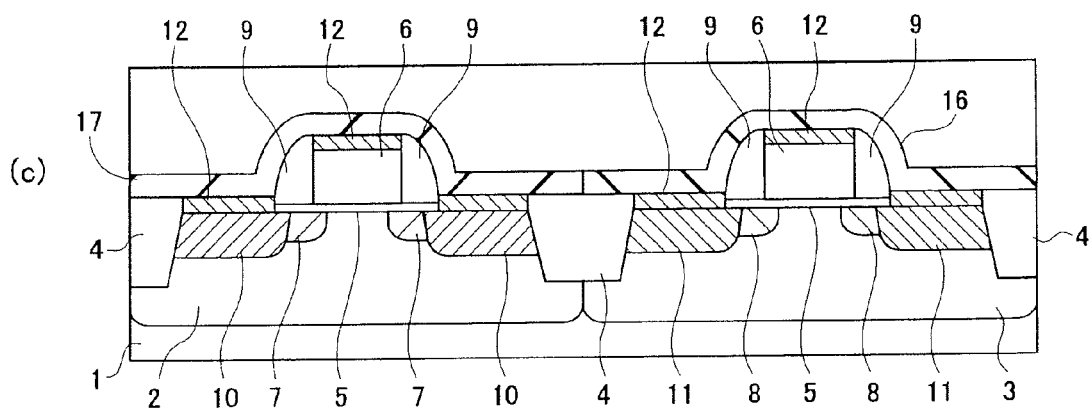

This Embodiment 3 has the objective of simplification of the manufacturing steps of the above-described Embodiment 1. FIG. 5 illustrates a process flow in which views (a), (b) and (c) are each a schematic cross-sectional view of the structure in successive steps in the manufacture of a semiconductor device of Embodiment 3 of the present invention. In FIG. 5, an n channel conductivity type MISFET is illustrated on the left side, while a p channel conductivity type MISFET is illustrated on the right side.

As illustrated in FIG. 5 at view (a), after formation of n channel conductivity type and p channel conductivity type MISFETs and a silicide layer 12 in a manner similar to Embodiment 1, a silicon nitride film 16 for generating a compressive stress in the channel formation region of the p channel conductivity type MISFET 3 is deposited as an insulating film by plasma CVD. This silicon nitride film 16 is formed, for example, under conditions of a high frequency power of 350 to 400 W.

A resist film R, which covers the upper surface of the p channel conductivity type MISFET and has an opening on the n channel conductivity type MISFET, is formed over the circuit formation surface of the p type substrate 1. Using this resist film R as an impurity introducing mask, an impurity such as Ar, Ge, Si, As, Sb, In, $BF_2$ or the like is introduced into the silicon nitride film 16, that is exposed from the resist R, by ion implantation, as illustrated in FIG. 5 at view (b). The silicon nitride film into which such an impurity has been introduced is indicated by the reference numeral 17.

After removal of the resist film R, an interlevel insulating film 15, which is made, for example, of silicon oxide, is deposited all over the circuit formation surface of the p type substrate 1 by plasma CVD, as illustrated in FIG. 5 at view (c). Then, the surface of the interlevel insulating film 15 is planarized by CMP. A contact hole and metallization layer are then formed in a manner known per se in the art, whereby the semiconductor device of this Embodiment is completed.

The resulting silicon nitride film 16 over the p channel conductivity type MISFET has a compressive stress of −800 to −1000 MPa, and it generates a compressive stress in the channel formation region of the p channel conductivity type MISFET. The stress of the silicon nitride film 17 over the n channel conductivity type MISFET has been, on the other hand, markedly relaxed and has reached almost zero. In other words, the compressive stress in the channel formation region of the n channel conductivity type MISFET has been relaxed. As a result, compared with the case where the silicon nitride film 16 is not provided, the drain current of the p channel conductivity type MISFET is improved by 15 to 20%. The drain current of the n channel conductivity type MISFET hardly exhibits a decrease, even if the silicon nitride film 16 having a high compressive stress has been applied.

This is due to destruction of the crystallinity in the silicon nitride film 16 by the impact of ion implantation. Observation on the cross section of the silicon nitride film shows a trace of apparent destruction. In this Embodiment, an impurity is introduced into only the silicon nitride film over the n channel conductivity type MISFET; however, if there is a clear difference in the relaxing effect, the impurity itself may exist on both the n channel and the p channel conductivity type MISFETs. In this case, however, the impurity content in the silicon nitride film over the n channel conductivity type MISFET must be greater, or the region destroyed by ion implantation must be larger. The size of the region thus destroyed, that is, the stress relaxing effect heavily depends on not only the concentration of an impurity to be introduced, but also the intensity of the energy thereof. For example, in this Embodiment, similar effects are available when the energy of an impurity to be introduced in the silicon nitride film over the n channel conductivity type MISFET is greater than that of an impurity to be introduced in the silicon nitride film over the p channel conductivity type MISFET. It is desired that a more than half of the amount of the thus-introduced impurity exists in the silicon nitride film 16, because damage caused by ion implantation happens to adversely affect the MISFET.

In this Embodiment, upon formation of the silicon nitride film 16 and heat treatment up to the completion of the device, after the selective ion implantation step, the maximum temperature is 700° C. Such a relatively low-temperature heat treatment hardly causes re-crystallization of the silicon nitride film that has been destroyed by ion implantation. Accordingly, the stress after ion implantation is substantially retained as a residual stress even after the completion of the device.

According to Embodiment 3, since the stress in the film can be relaxed or reversed in direction by ion implantation of an impurity into the silicon nitride film 16, similar effects to Embodiment 1 are available in this Embodiment. Compared with the above-described Embodiment 1, the manufacturing steps can be simplified, because a silicon nitride film can be formed by one step and a step of forming a second silicon nitride film and its removal step can be omitted. It is needless to say that the film stress on the side of the p channel conductivity type MISFET may be changed by ion implantation. In this case, after formation of a silicon nitride film for generating a tensile stress in the channel formation region of the n channel conductivity type MISFET all over the circuit formation surface of the p type substrate 1, the above-described impurity is selectively introduced into the silicon nitride film over the p channel conductivity type MISFET by ion implantation. As an ion (impurity) to be implanted into the silicon nitride film, relatively heavy ones bring about this effect at a low concentration, so that such ions are efficient, but any ions are usable without limitation.

Figure 11:
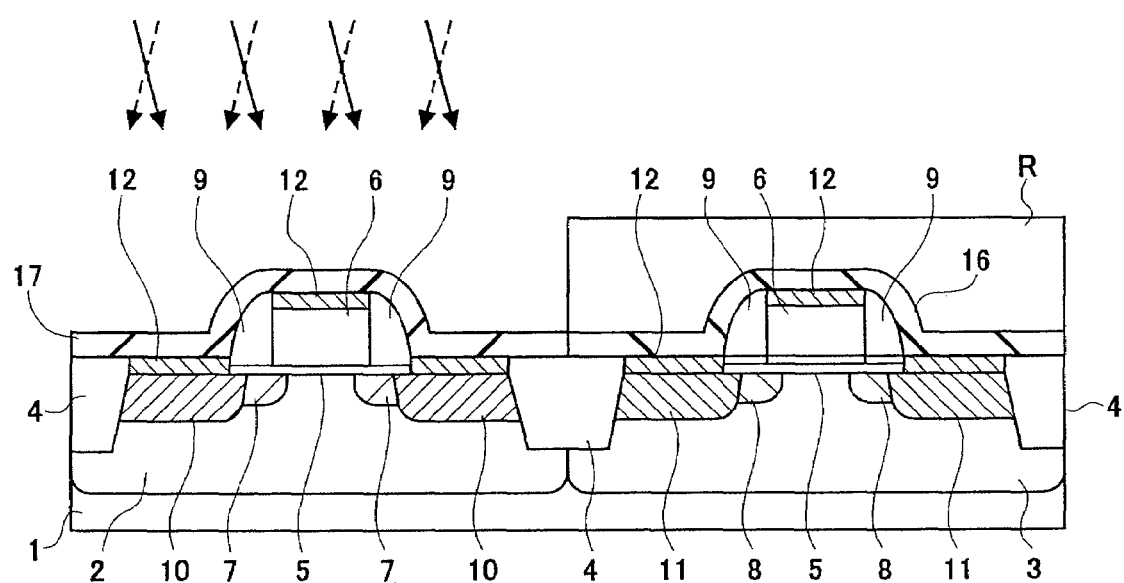
FIG. 11 is a schematic cross-sectional view illustrating an oblique implantation step in the fabrication of the semiconductor device according to Embodiment 3 of the present invention.

In this Embodiment, an ion is implanted perpendicularly with respect to the silicon substrate (wafer) for relaxing the stress, but, as illustrated in FIG. 11 (schematic cross-sectional view), oblique implantation may be applied. In this case, an impurity can be implanted also into a gate side-wall portion (step portion) of the silicon nitride film 16 covering the gate electrode of the MISFET. As a result, further stress relaxing effects are available.

Embodiment 4

This Embodiment 4 is a modification of method of manufacture of a semiconductor device according to Embodiment 1 of the present invention. This Embodiment will be explained with reference to on FIG. 6 in which views (a), (b) and (c) are each a schematic cross-sectional view) of the structure at successive steps of the method.

Figure 6:
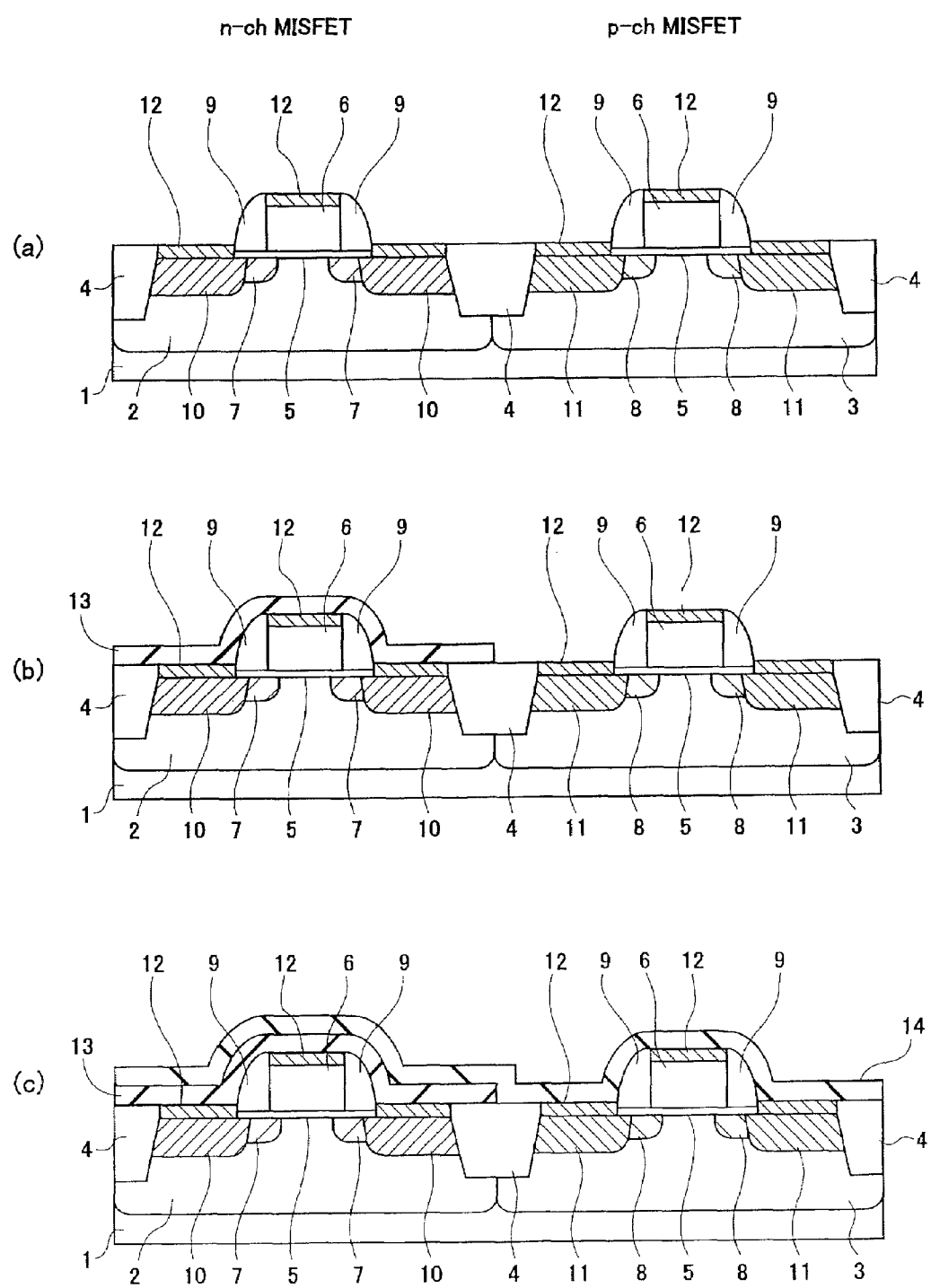
FIG. 6 is a process flow diagram which views (a), (b) and (c) are each a schematic cross-sectional view of the structure in successive steps in the manufacture of a semiconductor device according to Embodiment 4 of the present invention.

As illustrated in FIG. 6 at view (a), n channel conductivity type and p channel conductivity type MISFETs and a silicide layer 12 are formed in a manner similar to Embodiment 1.

Then, a silicon nitride film 13, which is about 100 to 120 nm thick, is deposited, as an insulating film, all over the circuit formation surface of the p type substrate 1 by plasma CVD. This silicon nitride film 13 is formed, for example, at a high frequency power of 350 to 400 W.

By use of a photo-etching technique, the silicon nitride film 13 is patterned to selectively cover the n channel conductivity type MISFET, as illustrated in FIG. 6 at view (b). In other words, the silicon nitride film 13 over the p channel conductivity type MISFET is removed. The silicon nitride film 13 thus formed is capable of selectively generating a tensile stress in the channel formation region of the n channel conductivity type MISFET.

As illustrated in FIG. 6 at view (c), a silicon nitride film 14, which is about 100 to 120 nm thick, is formed as an insulating film all over the circuit formation surface of the p type substrate 1 by plasma CVD. This silicon nitride film 14 is formed, for example, at a high frequency power of 600 to 700 W.

Then, an interlevel insulating film 15, which is made, for example, of silicon oxide, is formed all over the circuit formation surface of the p type substrate 1 by plasma CVD, followed by planarization of the surface of the interlevel insulating film 15 by CMP. A contact hole and a metallization layer are then formed in a manner known per se in the art, whereby the semiconductor device of this Embodiment is completed.

In this Embodiment 4, only the silicon nitride film 14 exists over the p channel conductivity type MISFET. Over the n channel conductivity type MISFET, on the other hand, both the silicon nitride films 13 and 14 exist. As a result, a large compressive stress is generated in the channel formation region of the p channel conductivity type MISFET, while a stress generated in the channel formation region of the n channel conductivity type MISFET has been relaxed. In this Embodiment, compared with the case in which there is no silicon nitride film, only the drain current of the p channel conductivity type MISFET is improved by 15 to 20%. At this time, the drain current of the n channel conductivity type MISFET hardly undergoes a change.

When an increase in the drain current of the n channel conductivity type MISFET is mainly intended, the silicon nitride film 14 is selectively formed over the p channel conductivity type MISFET first, and then the silicon nitride film 13 is formed all over the surface.

Compared with Embodiments 1 and 2, a photo-etching step for removing the silicon nitride film 14 over the n channel conductivity type MISFET is omitted in this Embodiment. As a result, the method steps in this Embodiment can be simplified compared with Embodiments 1 and 2.

In this Embodiment, by adopting different film thicknesses and film stresses between the silicon nitride films 13 and 14, the drain currents of the n channel conductivity type and p channel conductivity type MISFETS can be improved simultaneously. For example, in this Embodiment, by adjusting the thickness of the silicon nitride film 13 to 130 to 150 nm and that of the silicon nitride film 14 to 50 to 80 nm, lowering of the improvement in the drain current effects of the n channel conductivity type MISFET owing to the existence of the silicon nitride film 14 can be prevented.

Embodiment 5

Figure 7:
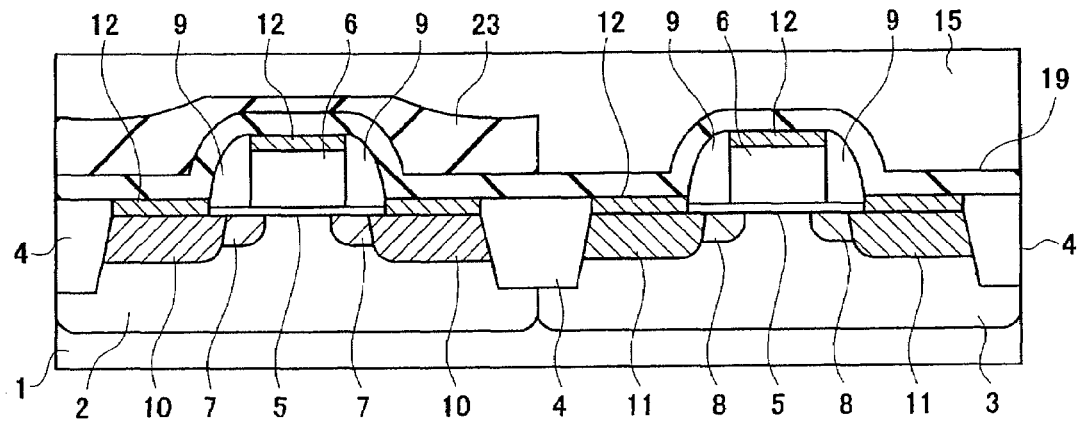
FIG. 7 is a schematic cross-sectional view roughly illustrating the structural configuration of a semiconductor device according to Embodiment 5 of the present invention.

FIG. 7 is a schematic cross-sectional view roughly illustrating the constitution of a semiconductor device representing Embodiment 5 of the present invention. In this embodiment, there is a coated oxide film (SOG (Spin On Glass) film) 23 having a tensile stress.

The semiconductor device according to Embodiment 5 is based on any combination of the above-described examples as a modification example of a film or structure controlling a stress. For example, as illustrated in FIG. 7, a silicon nitride film 19 for self alignment contact processing, which film has a compressive stress, is formed all over the circuit formation surface of the p type substrate 1, including the surface right above the gate electrode 6; an SOG film 23 having a tensile stress is formed over the silicon nitride film 19; and the SOG film 23 is patterned to selectively leave the SOG film 23 over only the n channel conductivity type MISFET. On the side of the n channel conductivity type MISFET, the compressive stress of the silicon nitride film 19 is offset with the tensile stress of the SOG film 23.

Embodiment 6

Figure 8:
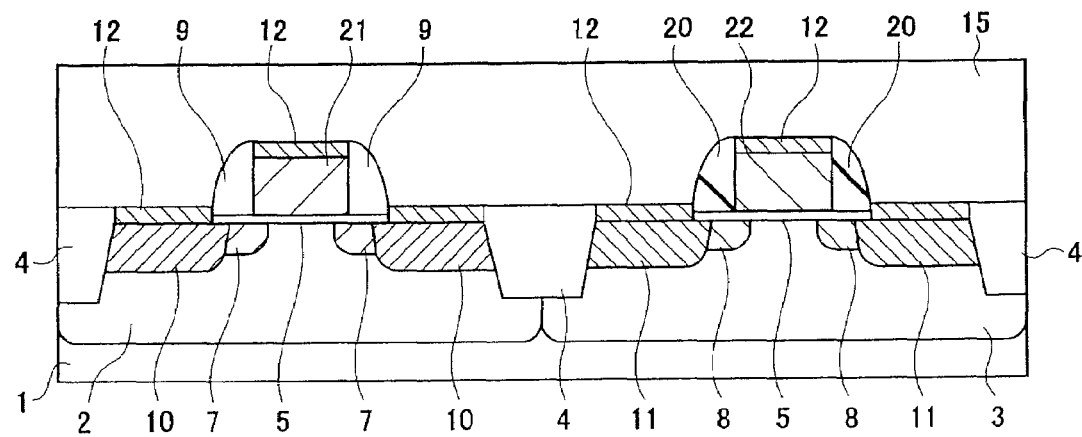
FIG. 8 is a schematic cross-sectional view roughly illustrating the structural configuration of a semiconductor device according to Embodiment 6 of the present invention.

FIG. 8 is a cross-sectional view roughly illustrating the constitution of a semiconductor device representing Embodiment 6 of the present invention. In this embodiment, there are side wall spacers 20 made of a silicon nitride film having a compressive stress, a gate electrode 21 having a tensile stress and a gate electrode 22 having a compressive stress.

The semiconductor device of this Embodiment 6 is, as illustrated in FIG. 8, a modification of the above-described embodiments having a film or structure controlling a stress. The stress is controlled in this embodiment by using, in combination, a change of the side wall spacers 9 of Embodiment 1 to the side wall spacers 20, which are made of a silicon nitride film having a compressive stress; a change of the gate electrode 6 to the gate electrode 21, which are made of a material having a tensile stress; and a change (including a structural change) of the gate electrode 6 to the gate electrode 22, which are made of a material having a compressive stress.

As one example of controlling the stress by changing the film or structure controlling the stress, use of different materials between the gate electrodes 6, more specifically, the introduction of a great amount of an impurity (Ge, Si, etc.) into the very one of the gate electrodes 6 can be carried out. The gate electrodes 6 may have a polymetal structure.

As another example of a change in the stress-controlling film or structure, it is possible to use different materials between the gate insulator of the n channel conductivity type MISFET and that of the p channel conductivity type MISFET. For example, a laminate film of a silicon nitride film and a silicon oxide film may be used for either one of the n channel conductivity type MISFET or the p channel conductivity type MISFET.

Embodiment 7

Figure 9:
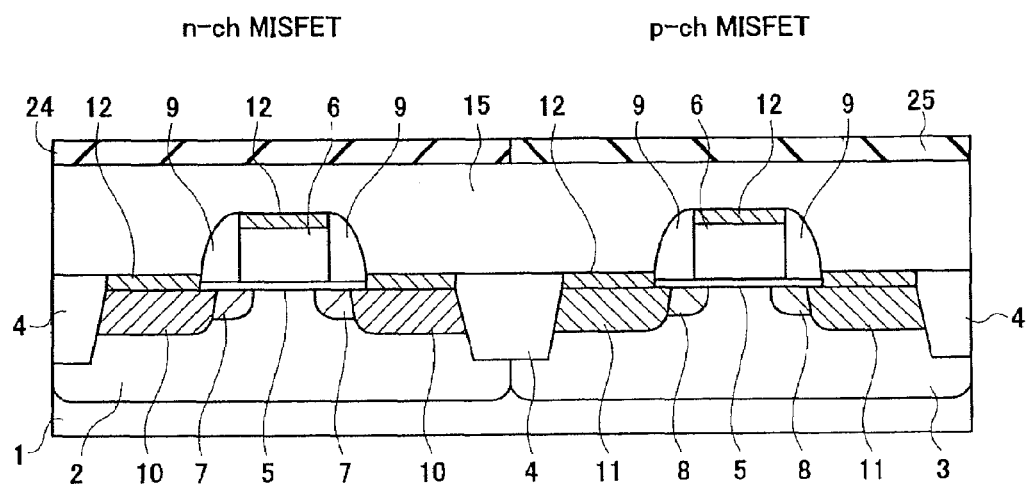
FIG. 9 is a schematic cross-sectional view roughly illustrating the structural configuration of a semiconductor device according to Embodiment 7 of the present invention.

FIG. 9 is a schematic cross-sectional view roughly illustrating the constitution of a semiconductor device according to Embodiment 7 of the present invention. Illustrated in FIG. 9 is an example of a device having a modified film or structure controlling the stress. Although a silicon nitride film serves as one of the interlevel insulating films, as in Embodiment 1, neither a silicon nitride film 13 having a tensile stress nor a silicon nitride film 14 having a compressive stress are formed directly over the gate electrode 6 of the n channel conductivity type MISFET and gate electrode 6 of the p channel conductivity type MISFET, respectively, but a silicon nitride film 24 having a tensile stress and a silicon nitride film 25 having a compressive stress are formed over the interlevel insulating film 15 above the gate electrode 6 of the n channel conductivity type MISFET and the interlevel insulating film 15 above the gate electrode 6 of the p channel conductivity type MISFET, respectively.

Such a constitution facilitates removal of one of the silicon nitride films.

Embodiment 8

Figure 10:
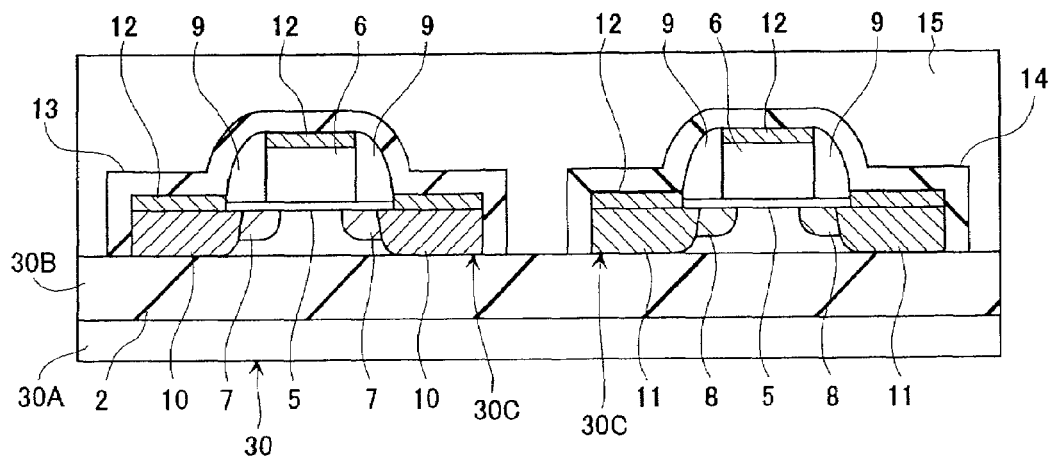
FIG. 10 is a schematic cross-sectional view roughly illustrating the structural configuration of a semiconductor device according to Embodiment 8 of the present invention.

FIG. 10 is a schematic cross-sectional view roughly illustrating the constitution of a semiconductor device according to Embodiment 8 of the present invention.

The semiconductor device according to this Embodiment 8 has an SOI structure, wherein an SOI (Silicon On Insulator) substrate 30 is employed. The SOI substrate 30, for example, is made of a supporting substrate 30A, an insulating layer 30B, which is disposed over this supporting substrate 30A and a semiconductor layer 30C disposed over this insulating layer 30B. The supporting substrate 30A is formed from a p type silicon substrate that is made of single crystal silicon; the insulating layer 30B is formed from a silicon oxide film; and the semiconductor layer 30C is formed from a p type semiconductor made of single crystal silicon. The semiconductor layer 30C is divided into a plurality of element forming portions, and each of these element forming portions has an n channel conductivity type MISFET or p channel conductivity type MISFET. In the element forming portion of the semiconductor layer 30C on which the n channel conductivity type MISFET is to be formed, a p type well region has been formed, while in the element forming portion of the semiconductor layer 30C on which the p channel conductivity type MISFET is to be formed, an n type well region has been formed.

A stress exhibits greater effects in this SOI structure, wherein the semiconductor layer 30C is thin. In addition, in the SOI structure, a stress can be controlled by changing the thickness of the insulating layer (embedded layer) 30B or by selectively introducing an impurity to the insulating layer 30B. As a result, both the effects of the present invention and the merit of this SOI structure are available in this Embodiment.

Application of the structure of the present invention to at least the peripheral circuit or logic circuit portion of the memory cell of products having a memory, such as a SRAM (Static Random Access Memory), DRAM (Dynamic Random Access Memory) or flash memory makes it possible to achieve increased performance.

The invention made by the present inventors so far has been described specifically based on the above-described Embodiments. However, it should be borne in mind that the present invention is not limited to or by these Embodiments, and it is needless to say that the embodiments can be modified to an extent not departing from the scope of the invention.

Advantages available by typical aspects of the invention, among the features disclosed by this application, will be described briefly.

The present invention makes it possible to improve the current driving capacity of the n channel conductivity type field effect transistor and p channel conductivity type field effect transistor.

The present invention makes it possible to suppress a lowering of the current driving capacity of one of the n channel conductivity type field effect transistor and the p channel conductivity type field effect transistor, and to improve the current driving capacity of the other one.

Since the stresses acting on the channel formation regions of the n channel conductivity type field effect transistor and the p channel conductivity type field effect transistor, respectively, can be controlled independently, the drain current ratio of the n channel conductivity type field effect transistor to the p channel conductivity type field effect transistor can be set freely to some extent.

As described above, the features relating to the present invention are effective when applied to a semiconductor device having an n channel conductivity type field effect transistor and a p channel conductivity type field effect transistor, and they are also useful when applied to semiconductor products, such as a memory IC (Integrated Circuit), a logic IC and a hybrid IC having a memory function and a logic function.

What is claimed is:

1. A semiconductor device comprising:
   a semiconductor substrate including a supporting substrate, an insulating layer formed over the supporting substrate and a first and a second silicon layer formed over the insulating film;
   an n channel conductivity type field effect transistor including a channel forming region formed in the first silicon layer,
   wherein the n channel conductivity type field effect transistor includes a source region and a drain region formed in the first silicon layer such that the channel forming region is formed between the source region and the drain region;
   a p channel conductivity type field effect transistor including a channel forming region formed in the second silicon layer,
   wherein the p channel conductivity type field effect transistor includes a source region and a drain region formed in the second silicon layer such that the channel forming region is formed between the source region and the drain region; and
   a first film including nitride, being formed over the n channel conductivity type field effect transistor and covering a gate electrode of the n channel conductivity type field effect transistor,
   wherein a gate length of the n channel conductivity type field effect transistor is less than 0.1 μm,
   wherein a gate length of the p channel conductivity type field effect transistor is less than 0.1 μm,
   wherein the first film generates a stress, in the direction of flow of a drain current, in the channel forming region of the n channel conductivity type field effect transistor, and
   wherein an interatomic distance of silicon in the direction of flow of a drain current in the channel forming region of the n channel conductivity type field effect transistor is greater than an interatomic distance of silicon in the direction of flow of a drain current in the channel forming region of the p channel conductivity type field effect transistor.

2. A semiconductor device according to claim 1, wherein the first film is comprised of a silicon nitride film.

3. A semiconductor device according to claim 1, wherein the stress is a tensile stress.

4. A semiconductor device according to claim 1, wherein the first film extends over side surfaces of the first silicon layer.

5. A semiconductor device according to claim 1, further comprising a second film including nitride, being formed over the p channel conductivity type field effect transistor and covering a gate electrode of the p channel conductivity type field effect, wherein the second film generates compressive stresses, in the direction of flow of a drain current, in the channel forming region of the p channel conductivity type field effect transistor.

6. A semiconductor device according to claim 5, wherein the second film extends over side surfaces of the second silicon layer.

7. A semiconductor device comprising:
a semiconductor substrate including a supporting substrate, an insulating layer formed over the supporting substrate and a first and a second silicon layer formed over the insulating film;
an n channel conductivity type field effect transistor including a channel forming region formed in the first silicon layer,
wherein the n channel conductivity type field effect transistor includes a source region and a drain region formed in the first silicon layer such that the channel forming region is formed between the source region and the drain region;
a p channel conductivity type field effect transistor including a channel forming region formed in the second silicon layer, wherein the p channel conductivity type field effect transistor includes a source region and a drain region formed in the second silicon layer; and
a first film for self alignment contact including nitride, being formed over the n channel conductivity type field effect transistor and covering a gate electrode of the n channel conductivity type field effect transistor,
wherein a gate length of the n channel conductivity type field effect transistor is less than 0.1 μm,
wherein a gate length of the p channel conductivity type field effect transistor is less than 0.1 μm,
wherein the first film for self alignment contact generates a stress in the direction of flow of a drain current in the channel forming region of the n channel conductivity type field effect transistor, and
wherein an interatomic distance of silicon in the direction of flow of a drain current in the channel forming region of the n channel conductivity type field effect transistor is greater than an interatomic distance of silicon in the direction of flow of a drain current in the channel forming region of the p channel conductivity type field effect transistor.

8. A semiconductor device according to claim 7, wherein the first film is comprised of a silicon nitride film.

9. A semiconductor device according to claim 7, wherein the stress is a tensile stress.

10. A semiconductor device according to claim 7, wherein the first film extends over side surfaces of the first silicon layer.

11. A semiconductor device according to claim 7, further comprises a second film for self alignment contact including nitride, being formed over the p channel conductivity type field effect transistor and covering a gate electrode of the p channel conductivity type field effect transistor,
wherein the second film generates compressive stresses, in the direction of flow of a drain current, in the channel forming region of the p channel conductivity type field effect transistor.

12. A semiconductor device according to claim 11, wherein the second film extends over side surfaces of the second silicon layer.

* * * * *

UNITED STATES PATENT AND TRADEMARK OFFICE
CERTIFICATE OF CORRECTION

| | |
|---|---|
| PATENT NO. | : 7,705,402 B2 |
| APPLICATION NO. | : 12/190433 |
| DATED | : April 27, 2010 |
| INVENTOR(S) | : Akihiro Shimizu et al. |

It is certified that error appears in the above-identified patent and that said Letters Patent is hereby corrected as shown below:

On the Title Page: item 60 should read as follows:

Division of application No. 11/641,758, filed on December 20, 2006, now patent No. 7,411,253, which is a continuation of application No. 11/541,575 filed on October 3, 2006, now Patent No. 7,414,293, which is a division of application No. 10/363,065 filed on August 13, 2003, now patent No. 7,115,954, which is a national phase of PCT/JP01/05633 filed on June 29, 2001.

Signed and Sealed this
Second Day of February, 2016

Michelle K. Lee
*Director of the United States Patent and Trademark Office*